United States Patent [19]

Ausschnitt et al.

[11] 4,290,384
[45] Sep. 22, 1981

[54] COATING APPARATUS

[75] Inventors: Christopher P. Ausschnitt, Southport; David A. Huchital, Fairfield, both of Conn.

[73] Assignee: The Perkin-Elmer Corporation, Norwalk, Conn.

[21] Appl. No.: 135,042

[22] Filed: Mar. 28, 1980

Related U.S. Application Data

[63] Continuation-in-part of Ser. No. 85,844, Oct. 18, 1929.

[51] Int. Cl.³ .................. C23C 13/04; C23C 13/12
[52] U.S. Cl. .................................. 118/722; 118/724; 118/726; 427/57; 427/255.6; 430/272; 430/311
[58] Field of Search .................. 427/57, 252, 255.6; 118/722, 715, 726, 724; 430/272, 311

[56] References Cited

U.S. PATENT DOCUMENTS 2,694,377  11/1954  Pawlyk .................. 118/715
2,753,800   7/1956  Pawlyk .................. 427/252
3,158,499  11/1964  Jenkins .................. 427/57
3,805,736   4/1974  Foehring et al. ........ 118/719
3,840,391  10/1974  Spitz .................... 427/57

Primary Examiner—Ralph S. Kendall
Attorney, Agent, or Firm—S. A. Giarratana; E. T. Grimes; T. P. Murphy

[57] ABSTRACT

An apparatus and method for coating a substrate with a thin film of material. The coating material is converted to a mist by means of an ultrasonic nebulizer and transported by a carrier gas to a chamber which contains the substrate where the mist is allowed to settle onto the substrate under the force of gravity. Sonic means are also provided to increase the settling rate of the mist droplets to lessen the settling time. Means are also provided to maintain the volume and concentration of the coating material in the nebulizer chamber over successive coatings.

29 Claims, 5 Drawing Figures

COATING APPARATUS

This application is a continuation-in-part of application Ser. No. 085,844 entitled "Coating Method and Apparatus" filed Oct. 18, 1979.

BACKGROUND OF THE INVENTION

In the fabrication of micro circuits a photoresist coated silicon wafer is exposed to ultra-violet light through a mask containing the circuit patterns to be formed on the wafer. The photoresist is developed or otherwise partially removed leaving the circuit pattern outlined on the wafer. During actual buildup of a complete circuit on the wafer, the wafer may have to be repeatedly coated with the photoresist material. The mask and, therefore, the wafer has a plurality of identical circuits arranged in rows and columns and once the process is completed the wafer is cut into rows and columns to form individual circuits.

A critical part of the foregoing described process is in the provision of silicon wafers coated with the light sensitive photoresist material. As the state of the art in the fabrication of micro circuits advances, it becomes more and more critical that the silicon wafers have a film of photoresist deposited thereon which is highly uniform and lacking defects such as striations.

The technique most widely in use for the coating of silicon wafers with photoresist is known as spinning. This method entails placing a drop of liquid photoresist material on a wafer which is spun. Due to the aerodynamic and centrifugal forces the photoresist eventually covers the entire wafer in a thin film. This method has the disadvantage of poor uniformity in coating thickness. For example, spin coating causes intrinsic and induced striations which are grooves or channels formed in the surface of the coating.

Intrinsic striations are caused by the nature of spin coating itself due to the outward radial movement of the liquid photoresist.

Induced striations are due to specks such as dust or foreign matter in the photoresist or on the wafer, as well as previously etched patterns on a wafer.

The spin coating of a wafer already etched with an array of patterns also exhibits nonuniformities due to the piling-up and thinning-out of photoresist in different areas of the etched pattern depending upon its location and orientation relative to the center of the wafer.

These striations and nonuniformities, which are areas of differing thickness of the photoresist layer, result in varying degrees of exposure sensitivity which lead to unreliable photoresist development such as removing too little or too much photoresist during development. This ultimately results in unreliable or failed circuit elements in the finished microcircuits.

Another disadvantage of the spin method of coating is that it is wasteful of the photoresist, with losses typically exceeding 99% of the material.

The present invention relates to an apparatus for coating wafers with photoresist material which overcomes the foregoing disadvantages and provides more economical coatings of uniform thickness free of the striations and nonuniformities encountered in spin coating.

SUMMARY OF THE INVENTION

The present invention relates to an apparatus for providing a thin uniform coating of material on a flat surface. More particularly the invention relates to an apparatus for providing a uniform thin coating of photoresist on a silicon wafer. A liquid photoresist is converted into a mist by means of ultrasonic nebulization and transported to a chamber containing a silicon wafer to be coated. The mist is then allowed to settle by gravity onto the silicon wafer thereby providing a uniform thin coating thereon. The present invention also includes sonic means to shorten significantly the settling time. The sonic technique uses a transducer mounted at the top of the settling chamber to provide resonant sonic waves within the chamber while the mist settles.

In addition to providing coatings of highly uniform, striation-free coatings the present invention greatly reduces loss of photoresist during the coating process. Nebulization and the transfer to the settling chamber have the advantage of elimination of large solid particles and impurities from the photoresist. Nebulization also insures that the mist is made up of droplets of uniform size which is an advantage over spray coating techniques.

Also, nebulization of a liquid photoresist, per se, forms an essential part of the present invention. Due to the characteristics of liquid photoresists nebulization must be carried on under a unique set of conditions.

DESCRIPTION

Figure 1:
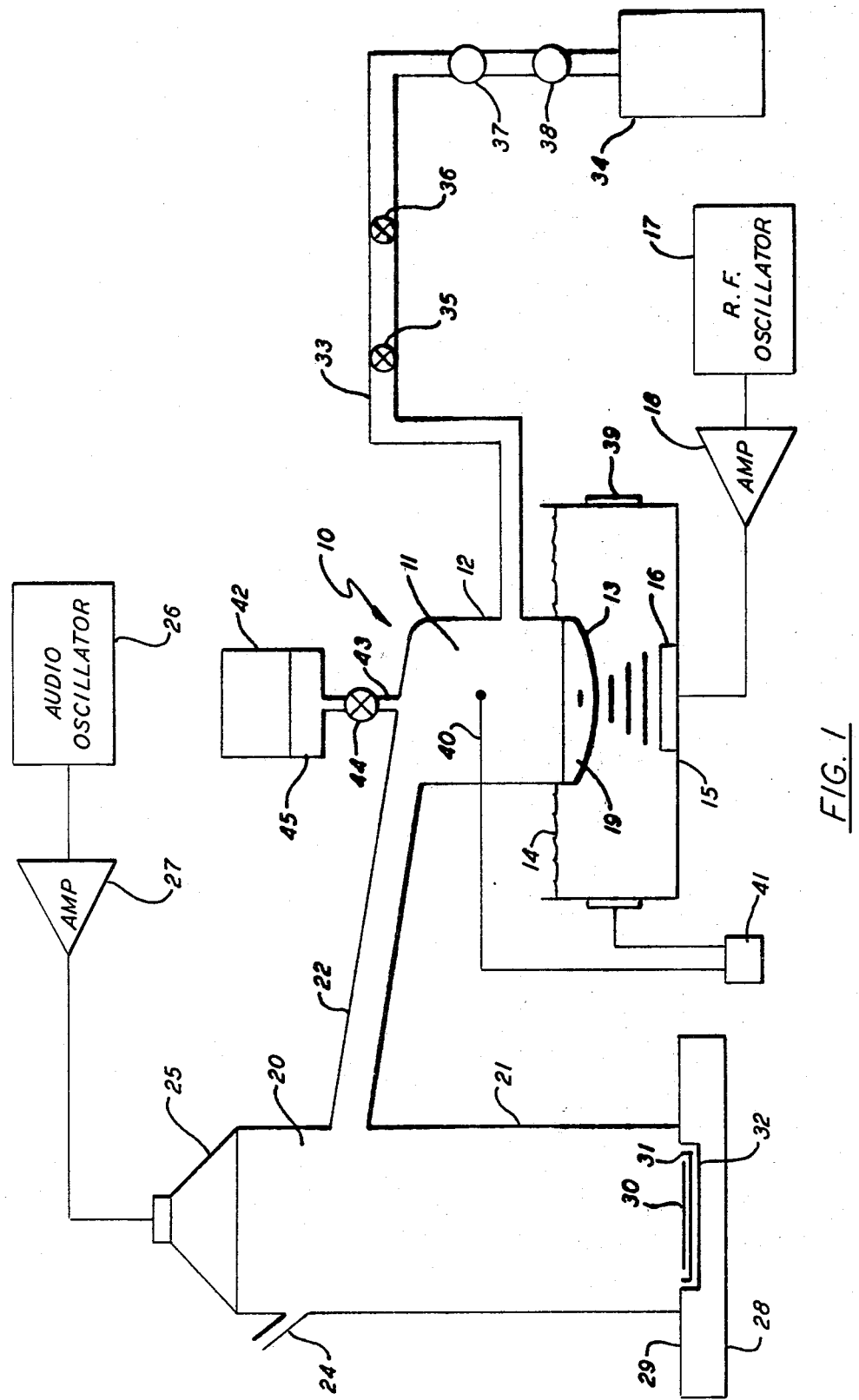
FIG. 1 illustrates in schematic form a preferred embodiment of the present invention.

Referring now more particularly to FIG. 1 there is shown the coating apparatus of the present invention. The coating apparatus of the present invention comprises a nebulizer 10 which includes a chamber 11 formed by cylinder 12. Attached to the bottom of the cylinder 12 forming one end thereof is a flexible membrane or diaphragm 13. The diaphragm 13 may be made of any sound transmissive material such as flexible plastic or mylar. The diaphragm 13 and a portion of the end of cylinder 12 are immersed in a liquid 14 held in tank 15. A transducer 16 is disposed at the bottom of the tank 15 directly beneath the diaphragm 13. An oscillator 17 is connected to the transducer 16 via an amplifier 18. The chamber 11 has at its bottom end a quantity of liquid photoresist 19 deposited therein. The upper surface of the photoresist 19 is maintained below the surface of the liquid 14.

The upper end of the chamber 11 is connected to chamber 20 through conduit 22.

The chamber 20 comprises a cylinder 21 which is significantly longer than the chamber cylinder 12. The conduit 22 is angled upwardly so that it communicates with the chamber 20 near the upper end of the cylinder 21. Use of an angled conduit 22 permits photoresist on the walls of conduit 22 to fall back into chamber 11 for reuse. The chamber 20 is vented to atmosphere by means of the vent tube 24. A transducer 25 which may be a speaker is disposed at the top end of the cylinder 21. Transducer 25 is connected to audio oscillator 26 through amplifier 27. The cylinder 21 is supported by base 28 which forms an air tight seal with the bottom end of the cylinder 21 at the surface 29 of the base 28.

A silicon wafer 30 is disposed at the bottom of the chamber 20. The wafer is held by carrier 31 which is slidable perpendicular to the plane of the drawing within the recess 32 formed in the base 28. In this way the wafer 30 may be easily inserted into and removed from the chamber 20. If desired, the carrier 31 may be dimensioned to hold more than one wafer to permit removal of a coated wafer while another is being coated.

A conduit 33 has one end connected to the chamber 11 near the bottom end of the cylinder 12. The other end of the conduit 33 is connected to a pressurized source of gas 34 through toggle valve 35, flow valve 36, flowmeter 37, and regulator 38.

The apparatus is designed so that a mist of a liquid photoresist which is created within chamber 11 is transported to chamber 20 where it is allowed to settle onto the surface of wafer 30.

The formation of a mist within a chamber 11 is accomplished by a process known as ultrasonic nebulization. In this process a liquid such as the liquid photoresist 19 is converted to a mist or aerosol by means of ultrasonic waves produced by the transducer 16 and transmitted through liquid 14 to the photoresist 19 through the diaphragm 13. The transducer 16 is energized by oscillator 17 via the amplifier 18. During the initial mist formation the chamber 11 is isolated from the pressurized gas from gas tank 34 by means of toggle valve 35 being in the closed position.

During generation of the mist within the chamber 11 the transducer 16 is driven at its mechanical resonance which in one practical example is 1.25 megahertz by means of RF oscillator 17 and power amplifier 18. The ultrasonic waves are transmitted through the liquid 14. The ultrasonic waves pass through the liquid photoresist 19. The mist or aerosol is formed at the surface of the photoresist. The diaphragm 13 also concentrates the ultrasonic waves at the surface of the photoresist 19 to enhance the atomization rate.

The liquid 14 is used to transfer the ultrasonic energy from the transducer 16 to the photoresist 19. Water is a good medium for the transfer. If a liquid were not used, the transducer 16 would have to be placed closely adjacent or contiguous with the diaphragm 13 which might erode the transducer 16 or cause excessive wear on the diaphragm 13. Additionally, the liquid 14 provides a thermal mass and, hence, permits the liquid 14 to be maintained at a predetermined temperature which does not respond to rapid changes in ambient temperatures. Further, the liquid 14 maintains the liquid photoresist which is immersed therein at a stable constant temperature.

The temperature of the liquid 14 and therefore the mist may be maintained by a heater 39 wrapped around the tank 15 and controlled by a thermocouple 40 for switching a source of power 41 to the heating tape when the temperature falls below a desired value.

In a practical embodiment for a photoresist of a given viscosity, e.g. Shipley 1350B, it has been found desirable to maintain the mist created within the chamber 11 at 155° Fahrenheit. Since deposition times and coating thicknesses may vary with mist temperature depending on the viscosity of the photoresist 19 plus other variables, it is important for reproducibility considerations that mist temperature be maintained constant. It has been found that acceptable coating of a liquid photoresist such as Shipley 1350B photoresist may be obtained by maintaining the mist between 130° and 190° Fahrenheit. Also acceptable coatings are obtained when the power at which the transducer is driven is between 10 and 40 watts. As aforesaid, the temperature and drive power conditions apply to 1350B Shipley photoresist. Conditions will vary depending upon the particular photoresist used.

Once a sufficient amount of mist is generated within the chamber 11 it is caused to be transferred into chamber 20 via conduit 22. The mist within the chamber 20 is then allowed to settle by precipitation onto the exposed surface of the wafer 30. A refill chamber 42 containing liquid photoresist 45 is connected to chamber 11 via tube 43 and valve 44 for the purpose of adding photoresist to chamber 11 to compensate for loss after a predetermined number of coatings. The concentration (resin:solvent) of the photoresist added to chamber 11 to compensate for the losses is lower than the concentration of the photoresist in chamber 11. This is due to the fact that the loss of solvent is greater than the loss of resin for each coating.

In a practical embodiment for Shipley 1350B photoresist it has been found that the concentration in the refill chamber should be between 1:2 and 1:3, where concentration is defined as the ratio of 1350B photoresist to the solvent AZ thinner.

It has been discovered by applicant that by causing an acoustic resonance within the chamber 20 the settling rate of the mist onto the wafer 30 is significantly increased.

Acoustic resonance is provided by means of acoustic transducer 25 powered by oscillator 26 via amplifier 27 at a frequency equal to the resonant acoustic frequency of the chamber 20 at a relatively low power, for example, 1 to 5 watts.

In a practical embodiment it has been found that a coating of one micron thickness of photoresist on the wafer 30 without acoustic resonance takes between one and two minutes whereas with acoustic resonance the settling time is reduced to 15 seconds. The specific frequency used is 310 Hz, the fundamental acoustic resonance of chamber 20. The next resonance at 620 Hz is more effective, but is more irritating to the human ear. Higher frequency resonances are less effective.

The manner in which the mist is transferred from chamber 11 to chamber 20 is described hereinbelow.

As aforesaid during the initial mist formation, the chamber 11 is isolated from the pressurized source of inert gas 34 by the toggle valve 35. On the other side of flow valve 36 gas pressure is at a higher pressure than atmosphere established by the gas regulator 38. Flow regulator 38 is adjusted so that the gas flow after the toggle valve 35 and flow valve 36 are opened reaches a low steady state value.

When the temperature in the chamber 11 reaches the desired value, for example, 155° Fahrenheit as measured by a thermocouple 40 which indicates that sufficient mist has formed, toggle valve 35 is opened. The high gas pressure existing in the conduit 33 between the toggle valve 35 and the flow valve 36 causes an initial rush of gas into the photoresist chamber via conduit 33. This initial rush pushes the mist from chamber 11 through the conduit 22 into the chamber 20. This displaces the air within the chamber 20 which escapes through vent 24. The mist then settles onto the wafer 30. As aforesaid settling time is decreased by use of speaker 25 causing acoustic resonance within the chamber 20.

It should be noted that wafer 30 may be introduced into chamber 20 after transfer of the mist thereto as well as before the mist is transferred to chamber 20. Introduction of the wafer 30 into chamber 20 after transfer of the mist results in better coating uniformity.

When the mist is in the chamber 20, the flutter valve 23 may be closed along with valves 35 and 36 to permit formation or more mist in the chanber 11 for coating the next wafer.

When the wafer 30 is coated, the carrier 31 may be slid out and the wafer 30 removed and replaced with a new wafer to be coated. As aforesaid the carrier 31 may be elongated or long enough to hold two or more wafers so that when wafer 30 is removed another wafer is automatically placed in position for coating.

Alternatively, the process may be automated with carrier 31 in effect forming a conveyor which is automatically moved to place a next wafer within the chamber 20 after the preceding wafer is coated. Also, the entire process may be automated by timing techniques for turning on power to the transducer 16, speaker 25 and opening and closing valves 35 and 36 all based on time requirements for coating a wafer to a desired coating thickness.

It should be noted that means other than that shown may be used for transferring a mist from chanber 11 to chamber 20. For example, a bellows arrangement may be used for puffing the mist into the chanber 20. The bellows could use any convenient gas, such as air.

Also, it should be noted that the average cost in photoresist material for coating a four inch wafer with e.g. Shipley 1350B to one micron thickness using the present invention is one cent as opposed to an average cost of fourteen cents for the spinning method.

As indicated above an important feature of the present invention resides in creating a mist or aerosol from a liquid photoresist by means of ultrasonic nebulization. While nebulization, itself, is not a new process for generating a mist from various liquids, its use as a means for atomizing liquid photoresists has to applicants' knowledge never been accomplished. Successful generation of a mist of liquid photoresist in sufficient quantities to permit efficient coating of substrates such as silicon wafers requires that certain difficulties associated with liquid photoresists be overcome. Liquid photoresist which consists of a resin dissolved in a volatile solvent is high in viscosity which militates against its atomization. Atomization of such a mixture must be capable of transferring the resin as well as the solvent to the aerosol state. In addition the critical properties of the photoresist e.g. its exposure, adhesion and development properties must not be lost, diminished or altered during atomization.

FIGS. 2-5 illustrate the interdependence of the atomization rate of a typical positive liquid photoresist, e.g., a photoresist of the Shipley 1300 series upon the amount of photoresist in the reservoir, the drive power to the transducer 16, the temperature of the photoresist and the concentration of the photoresist. The curves of FIGS. 2-5 are also typical of other positive liquid photoresists e.g., Hunt HPR204, Kodak 809, and Shipley AZ2400 with allowance for deviations in actual numerical valves due to differing properties of individual photoresist. Attempts to atomize a negative photoresist, Kodak 747, and another positive photoresist, Shipley AZ111, under similar conditions were not successful.

The data for the graphs of FIGS. 2-5 was obtained under the following fixed conditions utilizing an arrangement similar to that shown in FIG. 1. After atomization the photoresist aerosol was transferred to chamber 20 using for thirty seconds a nitrogen flow of ten standard cubic feet per hour. Five seconds after completion of the aerosol transfer a wafer was inserted at the base of chamber 20 and the aerosol was allowed to settle onto the wafer for ninety seconds. Upon removal and drying the thickness of the coating was measured.

The variation of the parameters in each graph was obtained while the parameters in the other graphs were held fixed as indicated by the dashed lines. These are shown at 50 ml in FIG. 2; a solution of 17% resin and 83% solvent which is equivalent to undiluted Shipley 1350B photoresist in FIG. 3, a temperature of 155° F. in FIG. 4 and a transducer drive power of 27.5 watts in FIG. 5. In addition, the frequency of oscillator 17 was maintained at mechanical resonance of the transducer which for the transducer used was 1.27 MHz.

Figure 2:
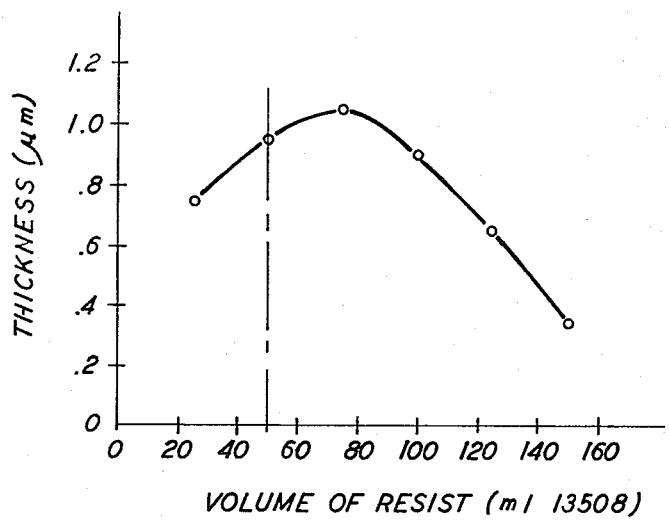
FIG. 2 is a graph of coating thickness versus photoresist volume.

FIG. 2 shows the variation in coating thickness as volume of photoresist in chamber 11 is varied. Changes in volume are primarily manifested as changes in depth of the photoresist which cause a change in power density at the surface the photoresist. Thus, an increase in depth results in the attenuation of the ultrasonic wave through the photoresist with a corresponding drop off in coating or atomization rate.

Figure 3:
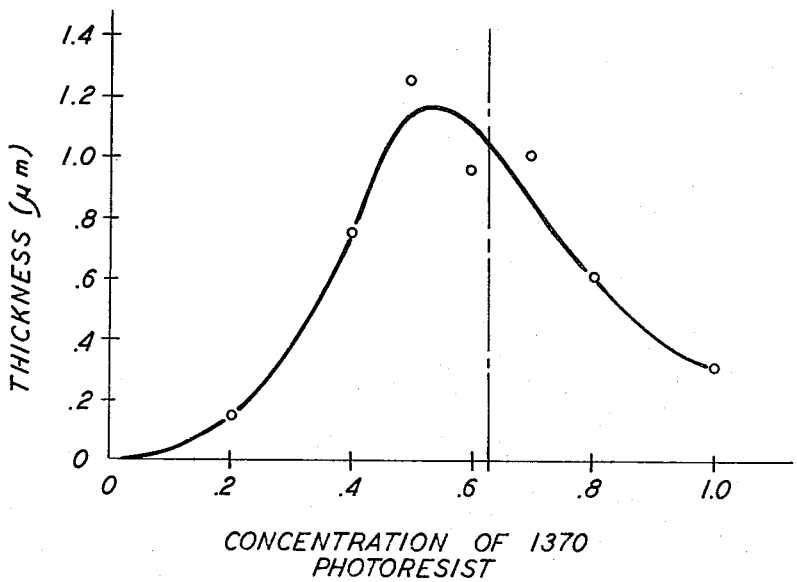
FIG. 3 is a graph of coating thickness versus photoresist concentration.

FIG. 3 illustrates a sharp power threshold below which no atomization occurs. This threshold is shown as 16 watts. Translated into acoustic power density at the photoresist surface this is equivalent to approximately 50-100 $mw.cm^{-2}$. Atomization increases as power is increased. However, saturation is apparent in the curve of FIG. 3. The observed saturation may be a function of the size of chamber 11 and/or the transducer characteristics, and does not necessarily indicate an upper limit to the atomization rate.

Since atomization is a function of power density at the surface of the photoresist, variations in volume need to be taken into account only to the extent that power density at the surface of the photoresist must be maintained above the threshold.

Figure 4:
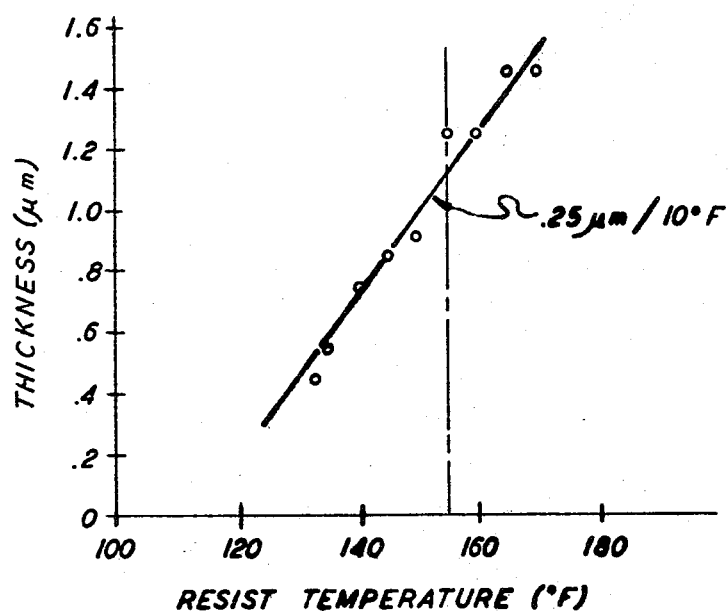
FIG. 4 is a graph of coating thickness versus photoresist temperature.

FIG. 4 shows that coating thickness varies roughly linearly with temperature. It has been found that above a certain temperature i.e. approximately 190° F., degradation of the photoresists such as, for example, photoresists of the Shipley 1300 series occurs i.e. exposure and developing times unduly lengthen. Below a certain temperature atomization is so slow as to make the coating below such temperature impractical from a commercial point of view.

Figure 5:
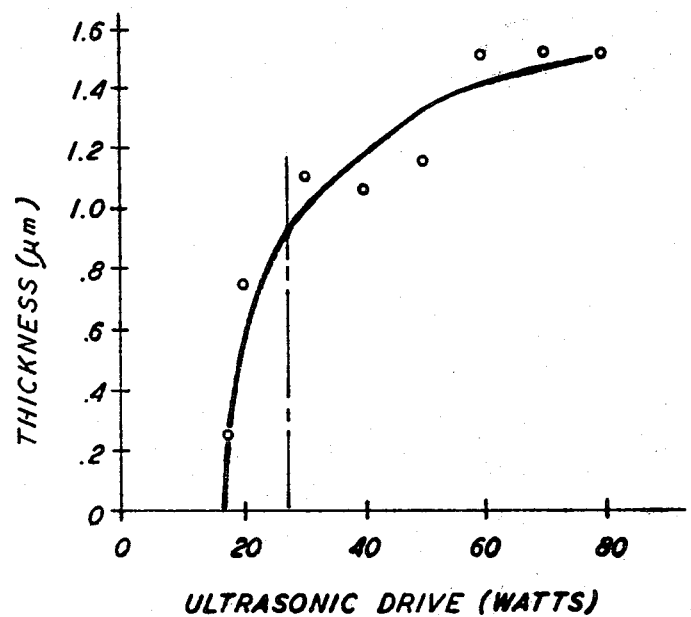
FIG. 5 is a graph of coating thickness versus ultrasonic nebulization drive power.

FIG. 5 shows the change in coating thickness versus variations in concentration of resin:solvent. At very low concentrations of resin atomization takes place but consists almost entirely of solvent which evaporates when the coating dries. At higher concentrations the viscosity of the photoresist increases and the rate of atomization decreases.

The value of all parameters in FIGS. 2-5 shown by the dashed lines are not necessarily optimum but merely indicate a set of conditions which were initially adopted as standard for Shipley 1350B photoresist. Under these conditions a silicon wafer can be coated to a thickness of 1 $\mu$m in approximately two minutes without the use of acoustic resonance in the settling chamber. Deviation from the values indicated by the dashed lines can result in either longer or shorter coating times.

From study and experiment it has been determined that to nebulize a photoresist of the classes mentioned above to obtain a photoresist aerosol sufficient to deposit a 1 μm coating on a wafer in less than e.g. thirty minutes the following ranges should be adhered to:

| | Min. | Max. |
|---|---|---|
| Photoresist solids content | 1% | 50% |
| Reservoir Temperature | 50° F. | 200° F. |
| Acoustic power density at the photoresist surface | 10mw . cm$^{-2}$ | — |

While successful depositions are possible outside one or more of the ranges set forth above, cost and time considerations may make such impractical.

Other modifications of the present invention are possible in light of the above description which should not be deemed as limiting the invention beyond those limitations contained in the claims which follow.

What is claimed is:

1. An apparatus for creating an aerosol from a liquid photoresist, comprising in combination;

a reservoir of liquid photoresist, first means providing an acoustic power density of at least 10 mw.cm$^{-2}$ at the surface of the photoresist to cause atomization of the photoresist.

2. An apparatus according to claim 1 wherein said first means comprises;

transducer means disposed adjacent said reservoir for transmitting ultrasonic waves through said photoresist.

3. An apparatus according to claim 1 or 2 further comprising;

second means for maintaining the temperature of the photoresist within a temperature range of 50° F.-200° F.

4. An apparatus according to claim 3 wherein concentration of solids versus liquid of the photoresist is between 1% to 50%.

5. An apparatus for creating an aerosol from a liquid photoresist, comprising in combination;

a reservoir of liquid photoresist, transducer means disposed adjacent said reservoir for transmitting ultrasonic waves through said photoresist providing an acoustic power density at the surface of the photoresist to cause atomization of the photoresist, means for maintaining the temperature of the photoresist within a temperature range of 50° F.-200° F.

6. An apparatus for creating an aerosol from a liquid photoresist, comprising in combination;

a reservoir of liquid photoresist, transducer means disposed adjacent said reservoir for transmitting ultrasonic waves through said photoresist providing an acoustic power density at the surface of the photoresist to cause atomization of the photoresist, the concentration of solids versus liquid of the photoresist is between 1% to 50%.

7. An apparatus according to claim 6 wherein said acoustic power density is at least 10 mw.cm$^{-2}$.

8. An apparatus for coating the surface of an object with a material, comprising in combination;

a first chamber containing the object to be coated, a second chamber communicating with said first chamber and containing the coating material, first means comprising a transducer for generating ultrasonic waves into said coating material for forming a mist of said coating material within said second chamber, second means for feeding a gaseous flow into said second chamber whereby to direct said mist to said first chamber, third means providing acoustic waves within said first chamber at a resonant frequency of said first chamber for increasing the rate of settling of the mist onto the object, and the means for communicating said chambers being an upwardly directed conduit whereby coating material condensing out will be returned to said second chamber.

9. An apparatus according to claim 8 wherein said second chamber comprises, a diaphragm closing one end of said second chamber, said one end of said second chamber containing the coating material positioned above said transducer means.

10. An apparatus according to claim 9 wherein said first means further comprises, a tank containing a liquid, said one end of said second chamber immersed in said liquid, said transducer means disposed within said tank directly beneath said diaphragm.

11. An apparatus according to claim 10 wherein said acoustic wave generating means comprises, acoustic transducer disposed at one end of said first chamber, audio oscillator means connected to said transducer.

12. An apparatus according to claim 11 further including, base means closing the other end of said first chamber supporting the object to be coated within the chamber.

13. An apparatus according to claim 12 wherein said base means comprises, a base supporting said first chamber, carrier means disposed within a recess formed in said base and moveable relative to said base.

14. An apparatus according to claim 13 wherein said second means comprises, fourth means providing a gas flow, first conduit means connecting said fourth means to said second chamber near said one end such that said mist is carried from said second chamber to said first chamber, valve means in said first conduit means for opening and closing said first conduit means.

15. An apparatus according to claim 14 wherein said fourth means comprises, a source of pressurized gas, regulator means for controlling the rate of gas flow through said conduit.

16. An apparatus according to claim 15 wherein said communicating conduits connects with the first chamber near an end of that chamber and said first chamber is substantially longer than said second chamber.

17. An apparatus according to claim 16 further comprising, fifth means associated with aid second chamber for replenishing said photoresist in said second chamber after a predetermined number of coatings.

18. An apparatus according to claim 17 wherein said carrier means is formed to support a plurality of said wafers whereby when one wafer is coated the next wafer to be coated may be moved into position for coating.

19. An apparatus according to claim 8 and including means for maintaining the temperature of the coating material within a predetermined range.

20. An apparatus according to claim 19 wherein, said transducer is driven at a power between ten and forty watts.

21. An apparatus according to claim 20 wherein said second chamber comprises,
a diaphragm closing one end of said second chamber, said one end of said second chamber containing the liquid photoresist positioned above said transducer means.

22. An apparatus according to claim 20 including,
a tank containing a liquid,
said one end of said second chamber immersed in said liquid,
said transducer means disposed within said tank beneath said diaphragm.

23. An apparatus according to claim 22 further including,
acoustic wave generating means for providing acoustic waves within said first chamber at a resonant frequency of said first chamber.

24. An apparatus according to claim 23 wherein said third means comprises,
a speaker closing one end of said first chamber,
audio oscillator means connected to said speaker.

25. An apparatus according to claim 24 further including,
base means closing the other end of said first chamber supporting the object to be coated within the chamber.

26. An apparatus according to claim 25 wherein said base means comprises,
a base supporting said first chamber,
carrier means disposed within a recess formed in said base and moveable relative to said base,
said carrier means formed to support a plurality of the objects to be coated whereby when one object is coated the next object to be coated may be moved into position for coating.

27. An apparatus according to claim 26 wherein said second means comprises,
fourth means providing a gas flow,
first conduit means connecting said fourth means to said second chamber near said one end such that said mist is carried from said second chamber to said first chamber,
valve means in said first conduit means for opening and closing said first conduit means.

28. An apparatus according to claim 27 wherein said fourth means comprises,
a source of pressurized gas,
regulator means for controlling the rate of gas flow through said conduit.

29. An apparatus according to claim 27 wherein said communicating conduit connects with the first chamber near an end of that chamber and said first chamber is substantially longer than the second chamber.

* * * * *